(12) United States Patent
Nakano et al.

(10) Patent No.: US 8,713,959 B2
(45) Date of Patent: May 6, 2014

(54) HEAT GENERATING BODY BOX HOUSING REFRIGERATION DEVICE

(75) Inventors: Yuuji Nakano, Aichi (JP); Hiroshi Shibata, Aichi (JP); Keisuke Koga, Aichi (JP); Mutsuhiko Matsumoto, Aichi (JP); Keisuke Tsuji, Aichi (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 13/511,458

(22) PCT Filed: Nov. 19, 2010

(86) PCT No.: PCT/JP2010/006797
§ 371 (c)(1),
(2), (4) Date: May 23, 2012

(87) PCT Pub. No.: WO2011/064972
PCT Pub. Date: Jun. 3, 2011

(65) Prior Publication Data
US 2012/0234034 A1 Sep. 20, 2012

(30) Foreign Application Priority Data
Nov. 25, 2009 (JP) .................................. 2009-267124
Nov. 17, 2010 (JP) .................................. 2010-256555

(51) Int. Cl.
*F25D 17/00* (2006.01)
(52) U.S. Cl.
USPC ........................................................ 62/333
(58) Field of Classification Search
USPC ................... 62/175, 238.1, 430, 333
See application file for complete search history.

(56) References Cited

U.S. PATENT DOCUMENTS

| 2,155,484 | A | * | 4/1939 | Gottlieb | 62/163 |
| 2,320,432 | A | * | 6/1943 | Henney | 62/180 |
| 3,059,448 | A | * | 10/1962 | McGrath | 62/203 |
| 4,105,064 | A | * | 8/1978 | Del Toro et al. | 165/233 |
| 4,240,269 | A | * | 12/1980 | Bussjager | 62/324.6 |
| 4,506,516 | A | * | 3/1985 | Lord | 62/117 |
| 4,567,733 | A | * | 2/1986 | Mecozzi | 62/175 |

(Continued)

FOREIGN PATENT DOCUMENTS

| JP | 60-113498 | 6/1985 |
| JP | 09-326582 | 12/1997 |

(Continued)

OTHER PUBLICATIONS

International Search Report of PCT Application No. PCT/JP2010/006797 dated Jan. 11, 2011.

*Primary Examiner* — Ljiljana Ciric
*Assistant Examiner* — Alexis Cox
(74) *Attorney, Agent, or Firm* — Panasonic Patent Center

(57) ABSTRACT

A heat generating body box housing refrigeration device includes a first refrigerant cycle in which a first condenser and a first evaporator are connected by a first refrigerant liquid pipe and a first refrigerant steam pipe and a second refrigerant cycle in which a second condenser and a second evaporator are connected by a second refrigerant liquid pipe and a second refrigerant steam pipe. The first refrigerant liquid pipe is connected between a first joint and a second joint, the first refrigerant steam pipe is connected between a third joint and a fourth joint, the second refrigerant liquid pipe is connected between a fifth joint and a sixth joint, and the second refrigerant steam pipe is connected between a seventh joint and an eighth joint.

10 Claims, 12 Drawing Sheets

(56) References Cited

U.S. PATENT DOCUMENTS

| | | | |
|---|---|---|---|
| 5,565,716 A * | 10/1996 | Tierney, Jr. | 307/154 |
| 5,655,598 A * | 8/1997 | Garriss et al. | 165/104.21 |
| 5,797,275 A * | 8/1998 | Forsman | 62/175 |
| 6,978,630 B2 * | 12/2005 | Wensink et al. | 62/175 |
| 2003/0213255 A1 * | 11/2003 | Nosaka | 62/175 |
| 2004/0016245 A1 * | 1/2004 | Pierson | 62/175 |
| 2004/0107709 A1 * | 6/2004 | Lee et al. | 62/175 |
| 2004/0107710 A1 * | 6/2004 | Lee et al. | 62/175 |
| 2006/0000232 A1 * | 1/2006 | Bureau et al. | 62/430 |
| 2008/0251236 A1 * | 10/2008 | Byon et al. | 165/43 |
| 2010/0083674 A1 * | 4/2010 | Merritt | 62/93 |

FOREIGN PATENT DOCUMENTS

| | | |
|---|---|---|
| JP | 10-261887 | 9/1998 |
| JP | 10-261888 | 9/1998 |
| JP | 2007-129095 | 5/2007 |

* cited by examiner

HEAT GENERATING BODY BOX HOUSING REFRIGERATION DEVICE

TECHNICAL FIELD

The present invention relates to a heat generating body box housing refrigeration device.

BACKGROUND ART

A heat generating body box housing a refrigeration device is used to refrigerate the inside of a box housing, such as a mobile-phone base station, which is closed while provided with an electronic component generating heat therein.

Recently a heat generation amount from a control board markedly increases with enhanced performance of the electronic component and with greater densities of the electronic components on the control board. With the progress of miniaturization of the box housing for the electronic components, there is a demand for the high performance and miniaturization of the refrigeration device and enhancement of a degree of freedom of a layout that the refrigeration device is installed in either a side surface or a top side of the box housing. For this reason, a method in which a heat pipe having a large heat transfer amount is used while the number of components decreases is well known as a method for refrigerating a refrigeration device (for example, PTL 1).

However, in the heat pipe, refrigerant steam that ascends by boiling and vaporization and refrigerant liquid that descends by condensation and devolatilization move in the same pipe. Therefore, the refrigerants face each other to disadvantageously degrade refrigerant circulation efficiency and heat exchange efficiency. For this reason, an evaporator that boils and vaporizes the refrigerant is separated from a condenser that condenses and devolatilizes the refrigerant. That is, a refrigerant steam pipe that communicates between the evaporator and the condenser is provided in order that the refrigerant boiled and vaporized by the evaporator moves to the condenser. A refrigerant liquid pipe that communicates between the condenser and the evaporator is also provided in order that the refrigerant condensed and devolatilized by the condenser moves to the evaporator. Specifically, there is well known a boiling refrigeration device, in which a refrigerant circuit is formed by the refrigerant steam pipe and the refrigerant liquid pipe and the refrigerant is circulated to efficiently release heat (for example, PTL 2).

The boiling refrigeration device as the heat generating body box housing refrigeration device of the background art will be described below with reference to FIGS. 20A and 20B. FIG. 20A is a front view illustrating the heat generating body box housing refrigeration device of the background art, and FIG. 20B is a side view illustrating the heat generating body box housing refrigeration device.

Boiling refrigeration device 201 is provided in main body box 207, and main body box 207 is partitioned by partition plate 206 to include a high-temperature portion 203 to which high-temperature air 202 vents located in a lower portion of main body box 207 and a low-temperature portion 205 to which low-temperature air 204 vents in an upper portion of main body box 207. Evaporator 209 in which refrigerant 208 is enclosed is disposed in high-temperature portion 203. Evaporator 209 receives the heat from high-temperature air 202 to boil and vaporize refrigerant 208.

Condenser 210 communicating with evaporator 209 is disposed in low-temperature portion 205. In condenser 210, refrigerant 208 boiled and vaporized by evaporator 209 releases the heat to low-temperature air 204, and refrigerant 208 is condensed and devolatilized. Evaporator 209 and condenser 210 communicate with each other by refrigerant steam pipe 211 and refrigerant liquid pipe 212, which pierce the partition plate 206.

Indoor-side blower 213 that blows high-temperature air 202 to high-temperature portion 203 and outdoor-side blower 214 that blows low-temperature air 204 to low-temperature portion 205 are also included. According to the above configuration, refrigerant 208 boiled and vaporized by evaporator 209 moves from evaporator 209 to condenser 210 through refrigerant steam pipe 211 by a density difference. Refrigerant 208 condensed and devolatilized by condenser 210 moves from condenser 210 to evaporator 209 through refrigerant liquid pipe 212 by the density difference. Therefore, refrigerant 208 naturally circulates to release the heat of high-temperature air 202 to low-temperature air 204.

In the heat generating body box housing refrigeration device of the background art, in order to efficiently exert capabilities of condenser 210 and evaporator 209, refrigerant steam pipe 211 and refrigerant liquid pipe 212 are diagonally provided such that the refrigerant evenly circulates to the whole surfaces of condenser 210 and evaporator 209. However, a circulation resistance increases with increasing distance from a point at which refrigerant steam pipe 211 of a header in an upper portion of evaporator 209 is connected toward an opposite corner portion in which the steam pipe is not connected. As a result, unfortunately the refrigerant circulation efficiency is degraded to decrease the heat exchange efficiency.

CITATION LISTS

Patent Literatures

PTL 1: Unexamined Japanese Patent Publication No. S60-113498

PTL 2: Unexamined Japanese Patent Publication No. 119-326582

SUMMARY OF THE INVENTION

A heat generating body box housing refrigeration device of the present invention that refrigerates a heat generating body box housing accommodating a heat generating body includes: a first condenser and a second condenser that condense a refrigerant; a first evaporator and a second evaporator that vaporize the refrigerant; and an outdoor blower that sucks air outside of the heat generating body box housing and blows the air to promote heat transfers of the first condenser and the second condenser, wherein the first condenser and the first evaporator are connected with a first refrigerant liquid pipe and a first refrigerant steam pipe to constitute a first refrigerant cycle, the second condenser and the second evaporator are connected with a second refrigerant liquid pipe and a second refrigerant steam pipe to constitute a second refrigerant cycle, the first condenser of a rectangular shape includes a first condenser steam header on an upper side and a first condenser liquid header on a lower side, the first evaporator of a rectangular shape includes a first evaporator steam header on an upper side and a first evaporator liquid header on a lower side, the second condenser of a rectangular shape includes a second condenser steam header on an upper side and a second condenser liquid header on a lower side, the second evaporator of a rectangular shape includes a second evaporator steam header on an upper side and a second evaporator liquid header on a lower side, the first condenser, the second condenser, the first evaporator, and the second evaporator are vertically disposed with distances provided from one another, the first refrigerant liquid pipe is connected between a first joint in one end portion of the first condenser liquid header and a second joint in one end portion of the first evaporator liquid header, the first refrigerant steam pipe is connected between a third joint of the first condenser steam header and a fourth joint of the first evaporator steam header, the third joint located diagonally with respect to the first joint in the first condenser, and, the fourth joint located diagonally with respect to the second joint in the first evaporator, the second refrigerant liquid pipe is connected between a fifth joint of the second condenser liquid header and a sixth joint of the second evaporator liquid header, the fifth joint located in a position facing another end portion different from that of the first joint, and the sixth joint located in a position facing another end portion different from that of the second joint, and the second refrigerant steam pipe is connected between a seventh joint of the second condenser steam header and an eighth joint of the second evaporator steam header, the seventh joint located in a position facing another end portion different from that of the third joint, and the eighth joint located in a position facing another end portion different from that of the fourth joint.

According to the above configuration, in the first refrigerant cycle and the second refrigerant cycle, the refrigerant circulation efficiency is degraded with increasing distance toward the end portion in which the steam pipe is not connected in the opposite direction to the point at which the steam pipe is connected in the upper portion of the evaporator, and the portion in which the heat exchange efficiency is degraded becomes the opposite direction to the direction of the refrigerant circulation efficiency. As a result, the heat generating body box housing refrigeration device in which the capability degradation of the heat exchange efficiency and refrigerant circulation efficiency can be compensated to improve the heat exchange efficiency can be obtained.

DESCRIPTION OF EMBODIMENTS

Figure 1:
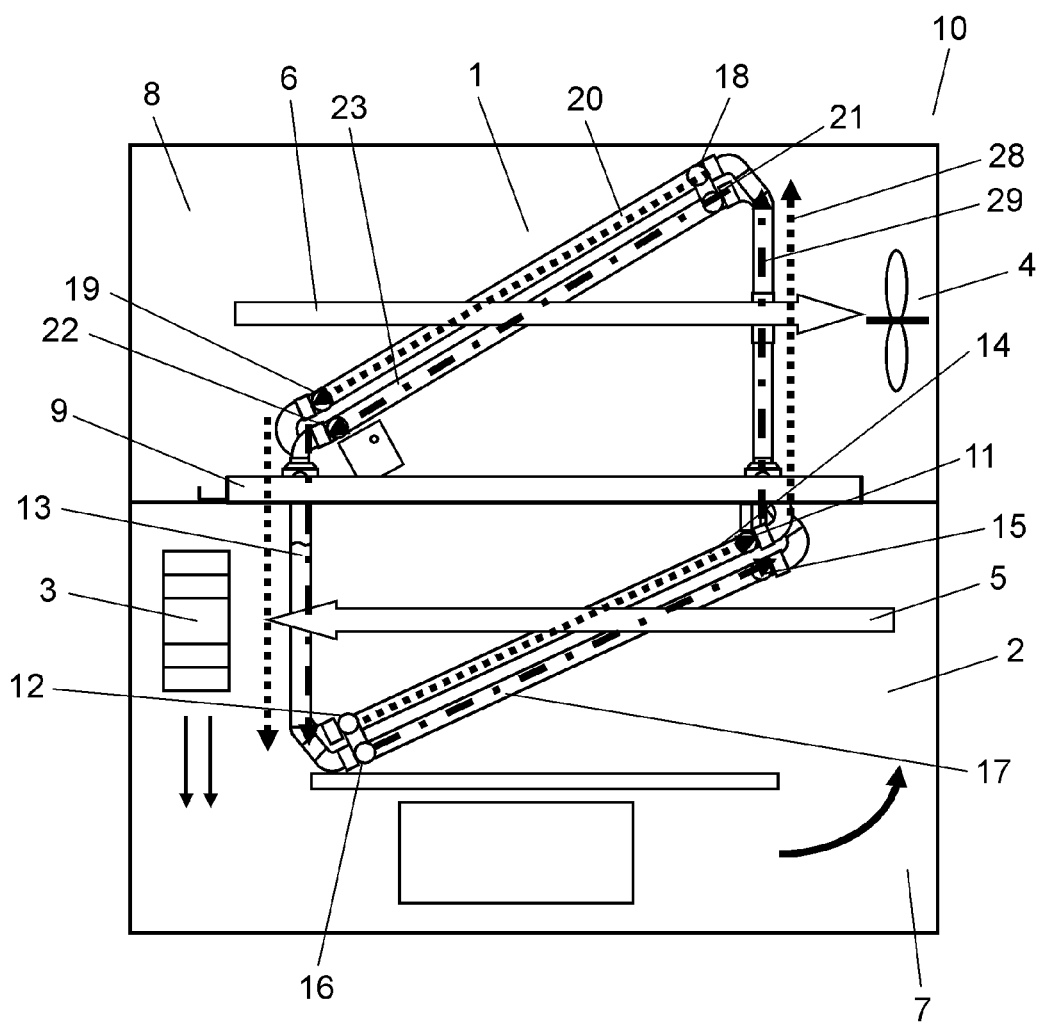
FIG. 1 is a side view illustrating a heat generating body box housing refrigeration device of a first exemplary embodiment of the present invention.

Hereinafter, exemplary embodiments of the present invention will be described with reference to the drawings.
First Exemplary Embodiment FIG. 1 is a side view illustrating a heat generating body box housing refrigeration device of a first exemplary embodiment of the present invention. As illustrated in FIG. 1, for example, heat generating body box housing refrigeration device 1 includes an electronic component generating heat like a mobile-phone base station, and heat generating body box housing refrigeration device 1 is installed above and below a top side (partition plate 9) of closed heat generating body box housing 2. In heat generating body box housing refrigeration device 1, indoor blower 3 and outdoor blower 4 blow air such that high-temperature air 5 and low-temperature air 6 flow in opposite directions to each other.

Figure 2:
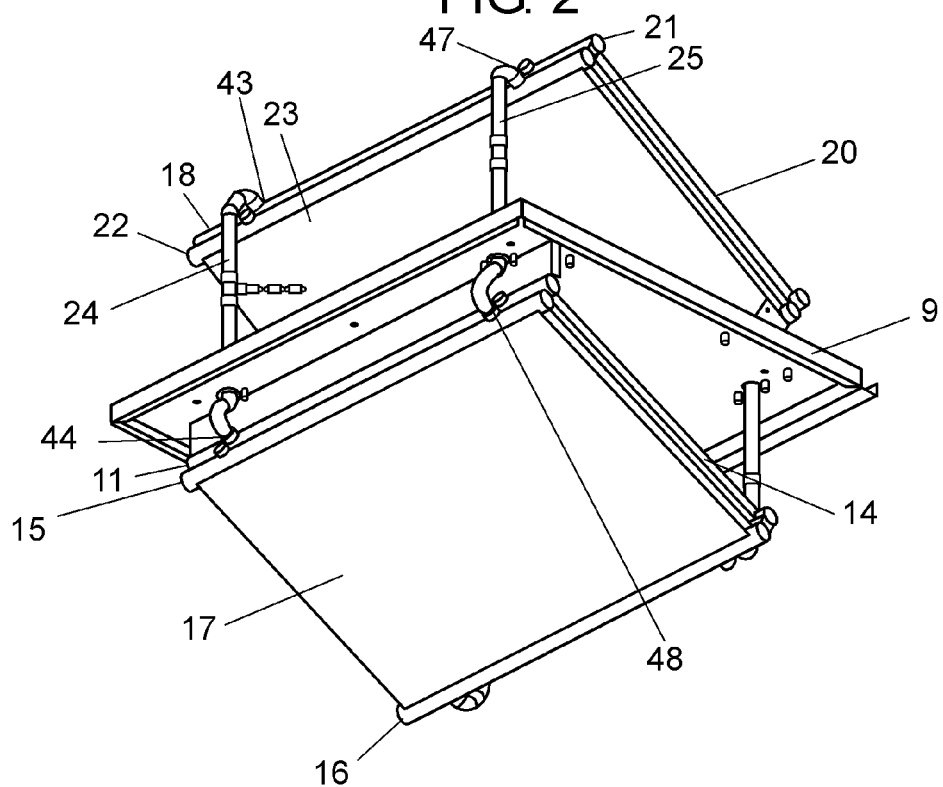
FIG. 2 is a perspective view illustrating a lower back surface of the heat generating body box housing refrigeration device.

FIG. 2 is a perspective view illustrating a lower back surface of heat generating body box housing refrigeration device of the first exemplary embodiment of the present invention. As illustrated in FIGS. 1 and 2, heat generating body box housing refrigeration device 1 is disposed in main body box 10 such that high-temperature portion 7 in which high-temperature air 5 vents is located in a lower portion of partition plate 9 and such that low-temperature portion 8 in which low-temperature air 6 vents is located in an upper portion of partition plate 9.

Rectangular first evaporator 14 is disposed in high-temperature portion 7, and includes first evaporator steam header 11 on an upper side and first evaporator liquid header 12 on a lower side. First evaporator 14 is disposed while inclined backward (or forward) with respect to a vent direction of indoor blower 3. Refrigerant 13 (for example, R134a) is enclosed in first evaporator 14, and refrigerant 13 receives the heat from high-temperature air 5 and is boiled and vaporized.

Similarly, rectangular second evaporator 17 is disposed in high-temperature portion 7, and includes second evaporator steam header 15 on the upper side and second evaporator liquid header 16 on the lower side. Second evaporator 17 is disposed below first evaporator 14 while inclined in the same direction as first evaporator 14. Refrigerant 13 (for example, R134a) is enclosed in second evaporator 17, and refrigerant 13 receives the heat from high-temperature air 5 and is boiled and vaporized.

Rectangular first condenser 20 is disposed in low-temperature portion 8, and includes first condenser steam header 18 on the upper side and first condenser liquid header 19 on the lower side. First condenser 20 is communicated with first evaporator 14, and first condenser 20 is disposed while inclined in the same direction as first evaporator 14. First condenser 20 condenses and devolatilizes a steam of boiled and vaporized refrigerant 13 by releasing the heat of the steam of refrigerant 13 to low-temperature air 6. Similarly, rectangular second condenser 23 is disposed in low-temperature portion 8, and includes second condenser steam header 21 on the upper side and second condenser liquid header 22 on the lower side. Second condenser 23 is communicated with second evaporator 17, and second condenser 23 is disposed below first condenser 20 while inclined in the same direction as first condenser 20. Second condenser 23 condenses and devolatilizes a steam of boiled and vaporized refrigerant 13 by releasing the heat of the steam of refrigerant 13 to low-temperature air 6. At this point, first condenser 20, second condenser 23, first evaporator 14, and second evaporator 17 are vertically disposed in parallel with distances provided from one another.

First refrigerant steam pipe 24 is connected to a right or left end portion of each of first evaporator steam header 11 and first condenser steam header 18 while piercing partition plate 9, whereby first refrigerant steam pipe 24 communicates between first evaporator steam header 11 and first condenser steam header 18. Similarly, second refrigerant steam pipe 25 is connected to end portions of second evaporator steam header 15 and second condenser steam header 21 while piercing partition plate 9, whereby second refrigerant steam pipe 25 communicates between second evaporator steam header 15 and second condenser steam header 21.

Figure 3:
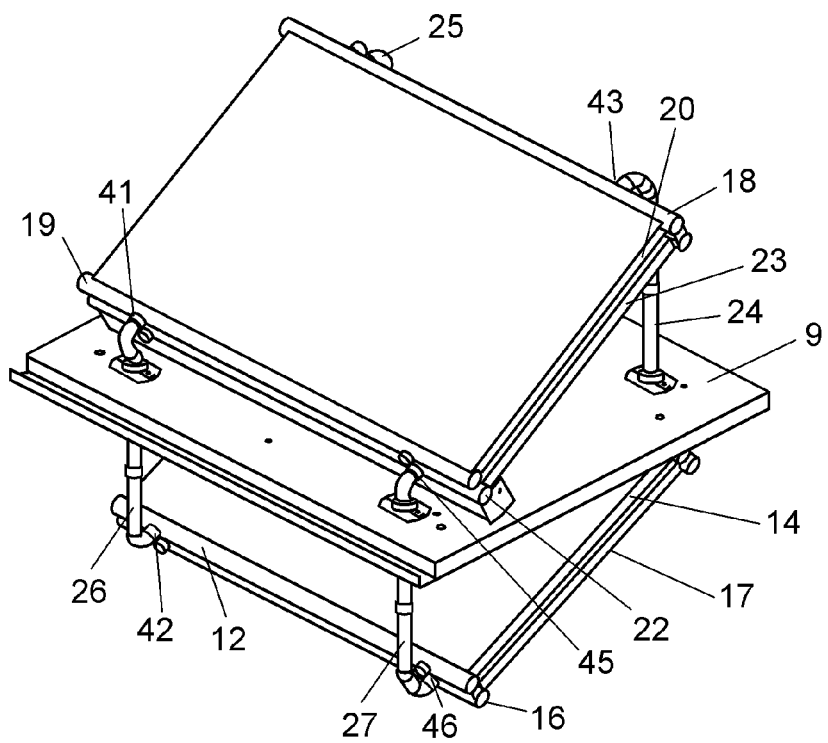
FIG. 3 is a perspective view illustrating an upper front surface of the heat generating body box housing refrigeration device.

FIG. 3 is a perspective view illustrating an upper front surface of the heat generating body box housing refrigeration device of the first exemplary embodiment of the present invention. First refrigerant liquid pipe 26 communicates between first evaporator liquid header 12 and first condenser liquid header 19 while piercing partition plate 9. First refrigerant liquid pipe 26 is diagonally connected with respect to first refrigerant steam pipe 24. Similarly, second refrigerant liquid pipe 27 communicates between second evaporator liquid header 16 and second condenser liquid header 22 while piercing partition plate 9. Second refrigerant liquid pipe 27 is diagonally connected with respect to second refrigerant steam pipe 25.

That is, in FIGS. 2 and 3, first refrigerant liquid pipe 26 is connected between first joint 41 in one end portion of first condenser liquid header 19 and second joint 42 in one end portion of first evaporator liquid header 12. First refrigerant steam pipe 24 is connected between third joint 43 of first condenser steam header 18 and fourth joint 44 of first evaporator steam header 11, which is diagonally located with respect to first joint 41 in first condenser 20, and fourth joint 44 which is located with respect to second joint 42 in first evaporator 14.

Second refrigerant liquid pipe 27 is connected between fifth joint 45 of second condenser liquid header 22 and sixth joint 46 of second evaporator liquid header 16, fifth joint 45 which is located in a position facing another end portion different from that of first joint 41, and sixth joint 46 which is located in a position facing another end portion different from that of second joint 42. Second refrigerant steam pipe 25 is connected between seventh joint 47 of second condenser steam header 21 and eighth joint 48 of second evaporator steam header 15, seventh joint 47 which is located in a position facing another end portion different from that of third joint 43, and eighth joint 48 which is located in a position facing another end portion different from that of fourth joint 44.

As illustrated in FIG. 1, heat generating body box housing refrigeration device 1 includes first refrigerant cycle 28 indicated by a dotted line and second refrigerant cycle 29 indicated by an alternate long and short dash line. First refrigerant cycle 28 is constructed such that first condenser 20 and first evaporator 14 are connected by first refrigerant liquid pipe 26 and first refrigerant steam pipe 24 in FIGS. 2 and 3. Second refrigerant cycle 29 is constructed such that second condenser 23 and second evaporator 17 are connected by second refrigerant liquid pipe 27 and second refrigerant steam pipe 25.

Thus, heat generating body box housing refrigeration device 1 of the first exemplary embodiment of the present invention includes first condenser 20 and second condenser 23 that condense the refrigerant and first evaporator 14 and second evaporator 17 that vaporize the refrigerant. Heat generating body box housing refrigeration device 1 also includes outdoor blower 4 that sucks air outside of heat generating body box housing 2 to promote heat transfers of first condenser 20 and second condenser 23.

Figure 4:
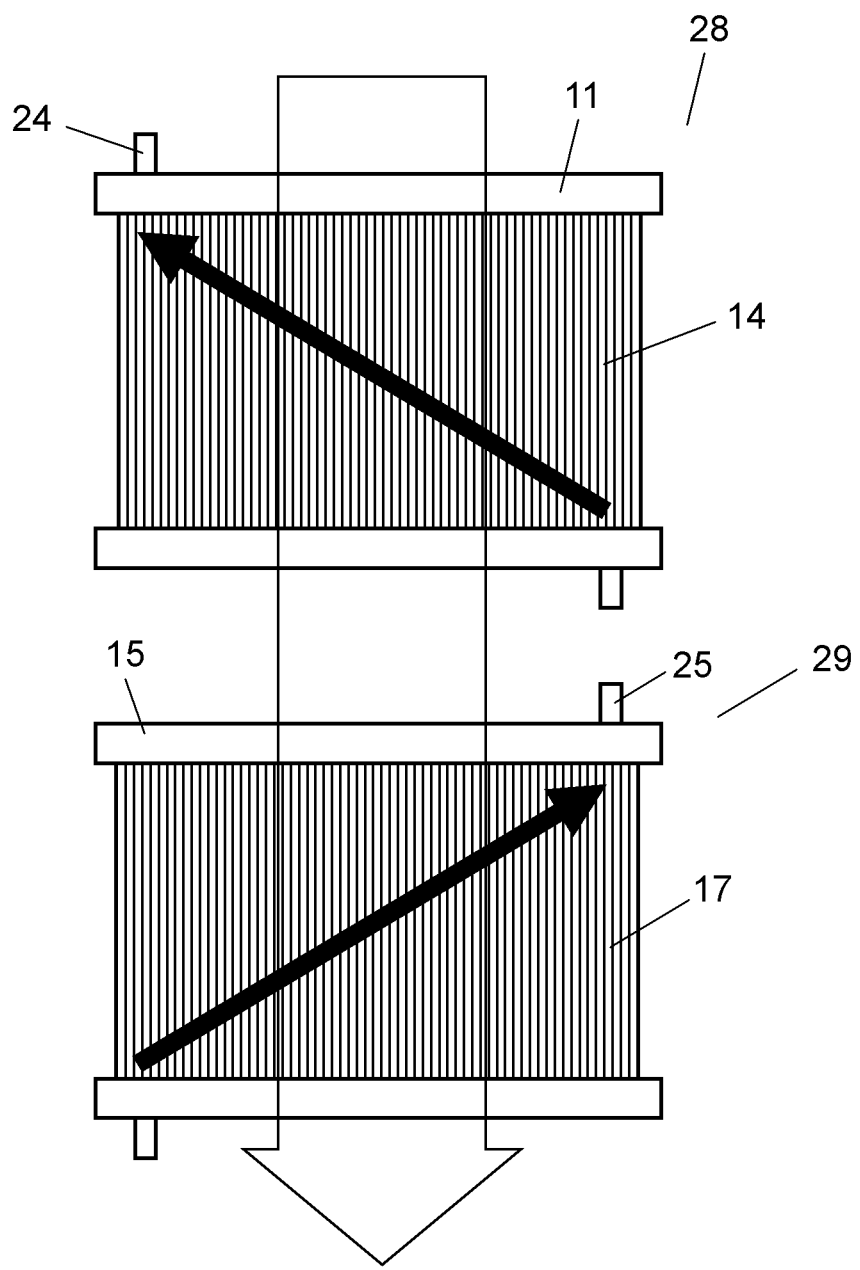
FIG. 4 is an explanatory view illustrating refrigerant circulations of a first refrigerant cycle and a second refrigerant cycle in the heat generating body box housing refrigeration device.

FIG. 4 is an explanatory view illustrating refrigerant circulations of a first refrigerant cycle and a second refrigerant cycle in the heat generating body box housing refrigeration device of the first exemplary embodiment of the present invention. As illustrated in FIG. 4, in first refrigerant cycle 28, refrigerant circulation efficiency becomes better on the side of first refrigerant steam pipe 24 of first evaporator 14. On the other hand, on the opposite side to first refrigerant steam pipe 24, the steam is hardly discharged, the circulation efficiency decreases to become high temperature, thereby decreasing heat exchange efficiency.

In second refrigerant cycle 29 that becomes a symmetric cycle, the refrigerant circulation efficiency becomes better on the side of second refrigerant steam pipe 25 of second evaporator 17. On the opposite side to first refrigerant steam pipe 24, the steam is hardly discharged, the circulation efficiency decreases to become high temperature, thereby decreasing the heat exchange efficiency. That is, heat generating body box housing refrigeration device 1 is used while the efficient portion of first refrigerant cycle 28 and the inefficient portion of second refrigerant cycle 29 overlap the inefficient portion of first refrigerant cycle 28 and the efficient portion of second refrigerant cycle 29. As a result, the decreased capabilities of first refrigerant cycle 28 and second refrigerant cycle 29 can be compensated to obtain heat generating body box housing refrigeration device 1 in which the heat exchange efficiency is enhanced.

First condenser 20 and second condenser 23, and first evaporator 14 and second evaporator 17 are inclined in the same directions. As a result, an installation space can vertically be reduced to facilitate the connections of first refrigerant liquid pipe 26, second refrigerant liquid pipe 27, first refrigerant steam pipe 24, and second refrigerant steam pipe 25.

As illustrated in FIG. 1, in heat generating body box housing refrigeration device 1 of the first exemplary embodiment of the present invention, the plural condensers and evaporators are connected by liquid pipes and the steam pipes from the lower stage. In lower-stage second refrigerant cycle 29, second evaporator 17 has an advantage to the refrigerant vaporization because high-temperature air 5 directly vents through second evaporator 17. However, second condenser 23 has a disadvantage to the refrigerant condensation because second condenser 23 is refrigerated using low-temperature air 6 that passes through first condenser 20 to raise temperature.

In an upper-stage first refrigerant cycle 28, first evaporator 14 has the disadvantage to the refrigerant vaporization because first evaporator 14 is heated by high-temperature air 5 that passes through second evaporator 17 to lower the temperature. On the other hand, first condenser 20 has the advantage to the refrigerant condensation because low-temperature air 6 directly vents to first condenser 20.

Thus, a bias of the capability of each cycle is eliminated, whereby the capabilities of the evaporator and condenser are hardly saturated or stop of the cycle is hardly generated. As a result, the heat generating body box housing refrigeration device of the first exemplary embodiment of the present invention is stabilized.

Second Exemplary Embodiment

In a heat generating body box housing refrigeration device according to a second exemplary embodiment of the present invention, the same structural element as the first exemplary embodiment is designated by the same reference mark, and its detailed description is omitted.

Figure 5:
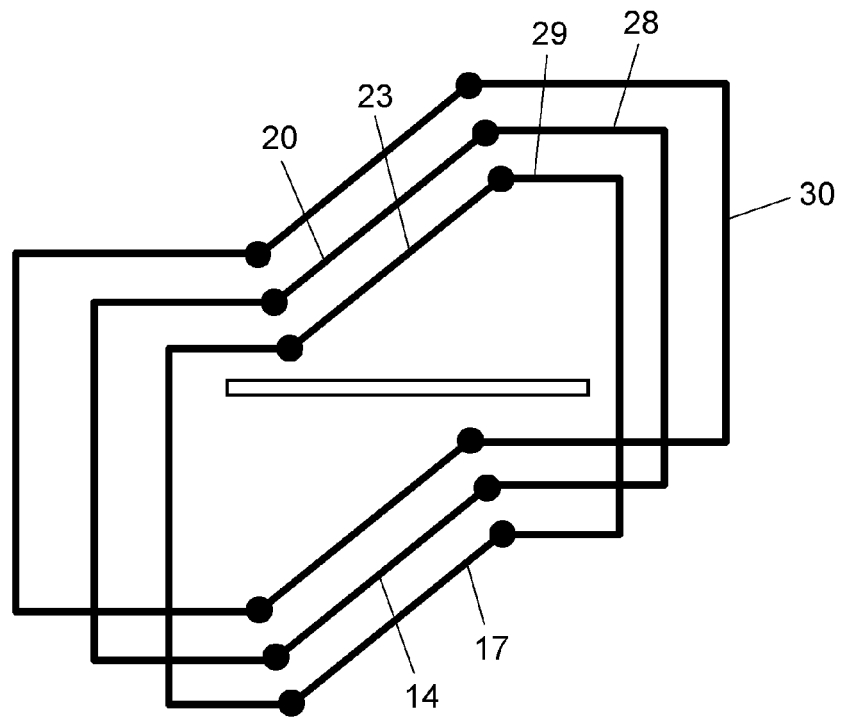
FIG. 5 is a sectional side view schematically illustrating a heat generating body box housing refrigeration device of a second exemplary embodiment of the present invention.

FIG. 5 is a sectional side view schematically illustrating the heat generating body box housing refrigeration device of the second exemplary embodiment of the present invention. As illustrated in FIG. 5, third refrigerant cycle 30 that is identical to first refrigerant cycle 28 and second refrigerant cycle 29 is provided in a position in which first refrigerant cycle 28 and second refrigerant cycle 29 are shifted in parallel. The three refrigerant cycles are provided in the heat generating body box housing refrigeration device of the second exemplary embodiment of the present invention.

As a result, because the heat generating body box housing refrigeration device can further ensure the refrigeration capability of heat exchange treatment performed by third refrigerant cycle 30, it is not necessary to enlarge horizontal and vertical dimensions of the evaporators and condensers of first refrigerant cycle 28 and second refrigerant cycle 29. The capability can flexibly be changed as needed basis while the dimensions are not changed by adjusting the number of refrigerant cycles.

Third Exemplary Embodiment

In a heat generating body box housing refrigeration device according to a third exemplary embodiment of the present invention, the same structural element as the first exemplary embodiment is designated by the same reference mark, and its detailed description is omitted.

Figure 6:
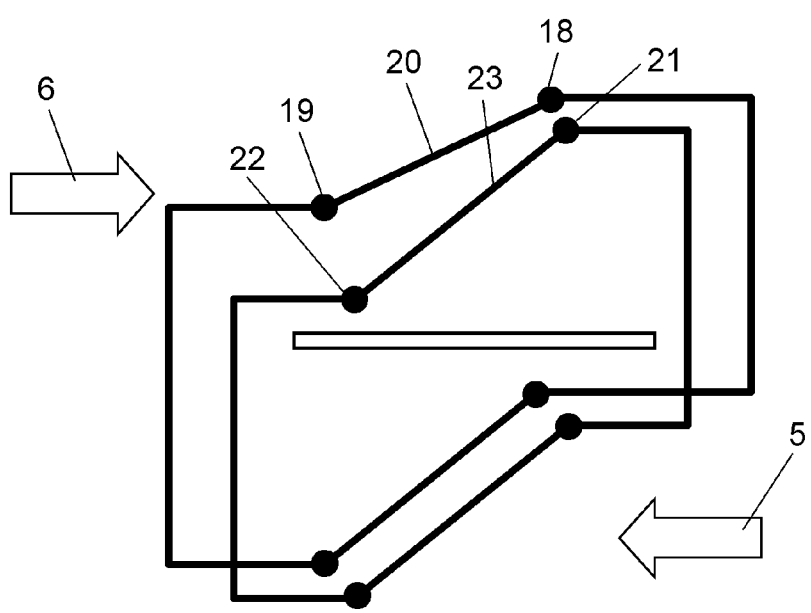
FIG. 6 is a sectional side view schematically illustrating a heat generating body box housing refrigeration device of a third exemplary embodiment of the present invention.

FIG. 6 is a sectional side view schematically illustrating the heat generating body box housing refrigeration device of the third exemplary embodiment of the present invention. As illustrated in FIG. 6, in first condenser 20 and second condenser 23 that are adjacent to each other, first condenser liquid header 19 and second condenser liquid header 22 are separated from each other while first condenser steam header 18 and second condenser steam header 21 are brought close to each other. That is, in first condenser 20 and second condenser 23, a distance between first condenser liquid header 19 and second condenser liquid header 22 is greater than a distance between first condenser steam header 18 and second condenser steam header 21.

Therefore, a proportion of a vent amount of low-temperature air 6, which directly vents to second condenser 23 without passing through first condenser 20, increases. As a result, the temperature of the air entering second condenser 23 is raised to ensure a temperature difference of the air before and after the air passes through second condenser 23, so that the heat generating body box housing refrigeration device that can enhance the refrigeration capability of second condenser 23 is obtained.

Fourth Exemplary Embodiment

In a heat generating body box housing refrigeration device according to a fourth exemplary embodiment of the present invention, the same structural element as the first exemplary embodiment is designated by the same reference mark, and its detailed description is omitted.

Figure 7:
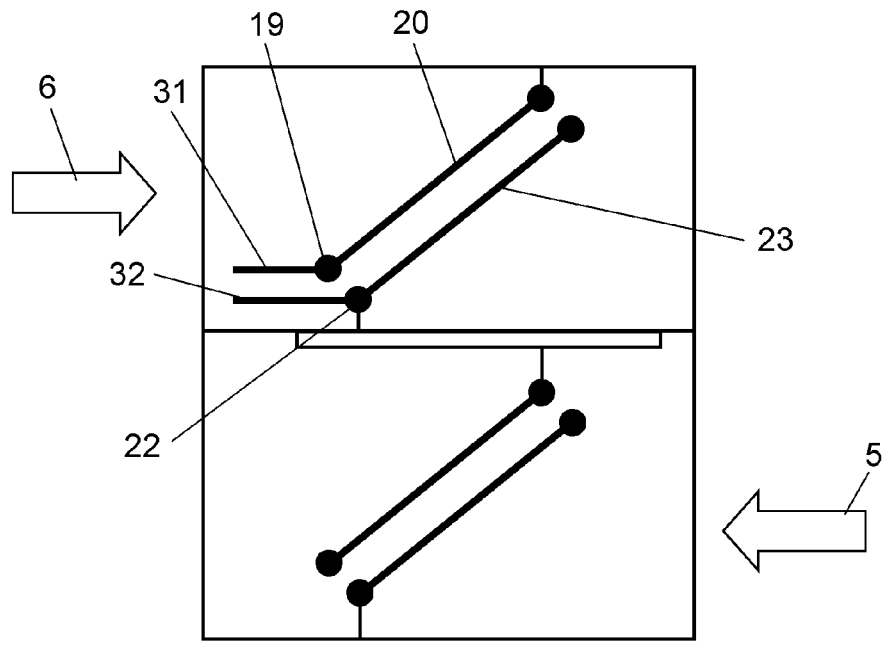
FIG. 7 is a sectional side view schematically illustrating a heat generating body box housing refrigeration device of a fourth exemplary embodiment of the present invention.

FIG. 7 is a sectional side view schematically illustrating the heat generating body box housing refrigeration device of the fourth exemplary embodiment of the present invention. As illustrated in FIG. 7, in first condenser 20 and second condenser 23 that are disposed in parallel at a distance, guide plates 31 and 32 are provided in first condenser liquid header 19 and second condenser liquid header 22 so as to be parallel to an air flow (low-temperature air 6) generated by outdoor blower 4 in FIG. 1.

Guide plates 31 and 32 facilitate the ventilation of low-temperature air 6 to second condenser 23 disposed in the lower stage. As a result, the heat exchange performance is improved in the heat generating body box housing refrigeration device of the fourth exemplary embodiment of the present invention.

Fifth Exemplary Embodiment

In a heat generating body box housing refrigeration device according to a fifth exemplary embodiment of the present invention, the same structural element as the first exemplary embodiment is designated by the same reference mark, and its detailed description is omitted.

Figure 8:
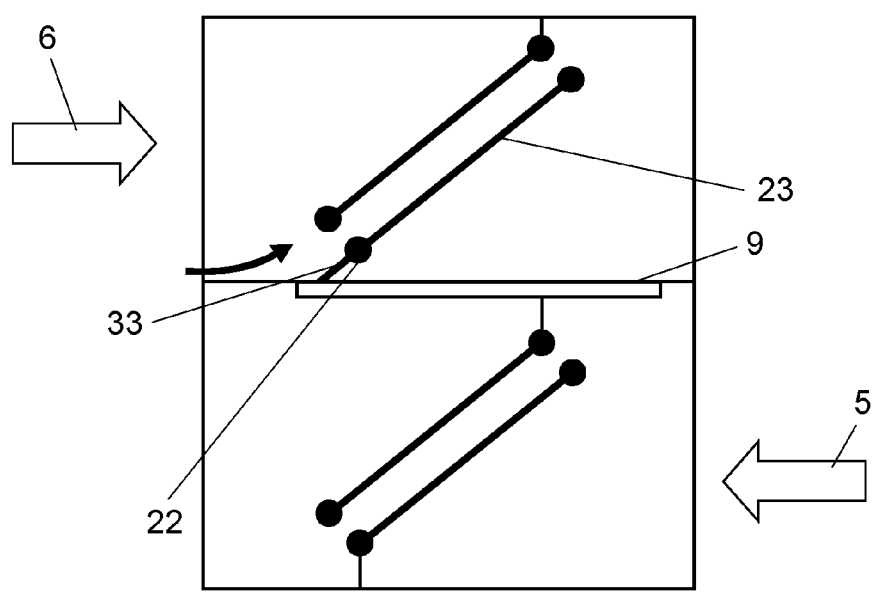
FIG. 8 is a sectional side view schematically illustrating a heat generating body box housing refrigeration device of a fifth exemplary embodiment of the present invention.

FIG. 8 is a sectional side view schematically illustrating the heat generating body box housing refrigeration device of the fifth exemplary embodiment of the present invention. As illustrated in FIG. 8, sealing component 33 that seals a gap between partition plate 9 and second condenser liquid header 22 is formed into an inclination shape so as to be substantially parallel to second condenser 23. That is, sealing component 33 having the inclination provided between partition plate 9 and one of first condenser 20 and second condenser 23, which is located closer to partition plate 9.

According to the above configuration, sealing component 33 guides a wind to a gap between first condenser 20 and second condenser 23, which are disposed in parallel at a distance, so that the ventilation of low-temperature air 6 is easily performed to lower-stage second condenser 23 while an original sealing function is secured. As a result, the heat exchange performance is improved in the heat generating body box housing refrigeration device of the fifth exemplary embodiment of the present invention.

Sixth Exemplary Embodiment

In a heat generating body box housing refrigeration device according to a sixth exemplary embodiment of the present invention, the same structural element as the first exemplary embodiment is designated by the same reference mark, and its detailed description is omitted.

Figure 9:
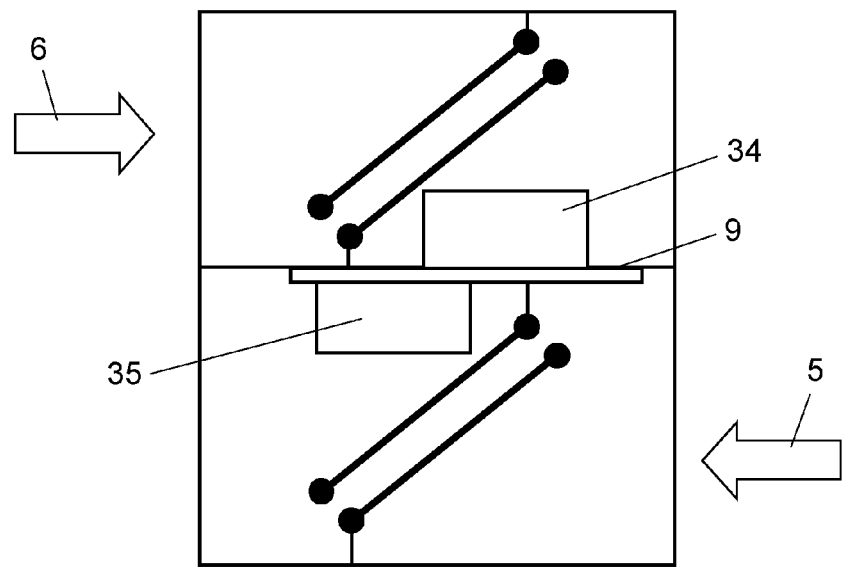
FIG. 9 is a sectional side view schematically illustrating a heat generating body box housing refrigeration device of a sixth exemplary embodiment of the present invention.

FIG. 9 is a sectional side view schematically illustrating the heat generating body box housing refrigeration device of the sixth exemplary embodiment of the present invention. As illustrated in FIG. 9, heat exchanger plate 34 and heat exchanger plate 35 are provided in upper and lower surfaces of partition plate 9 so as to be parallel to the air flow (low-temperature air 6) generated by outdoor blower 4 in FIG. 1. For example, heat exchanger plate 34 and heat exchanger plate 35 are formed into an L-shape, and heat exchanger plate 34 and heat exchanger plate 35 are fixed by screwing surfaces that are in contact with partition plate 9.

According to the above configuration, the heat is released in heat exchanger plate 34 provided on the upper side of partition plate 9, and the heat is absorbed from high-temperature air 5 that already passes through second evaporator 17 in heat exchanger plate 35 provided on the lower side of partition plate 9, and heat exchange is performed by a heat sink effect. Therefore, the heat exchange capability is enhanced in the heat generating body box housing refrigeration device of the sixth exemplary embodiment of the present invention.

Seventh Exemplary Embodiment

In a heat generating body box housing refrigeration device according to a seventh exemplary embodiment of the present invention, the same structural element as the first exemplary embodiment is designated by the same reference mark, and its detailed description is omitted.

Figure 10:
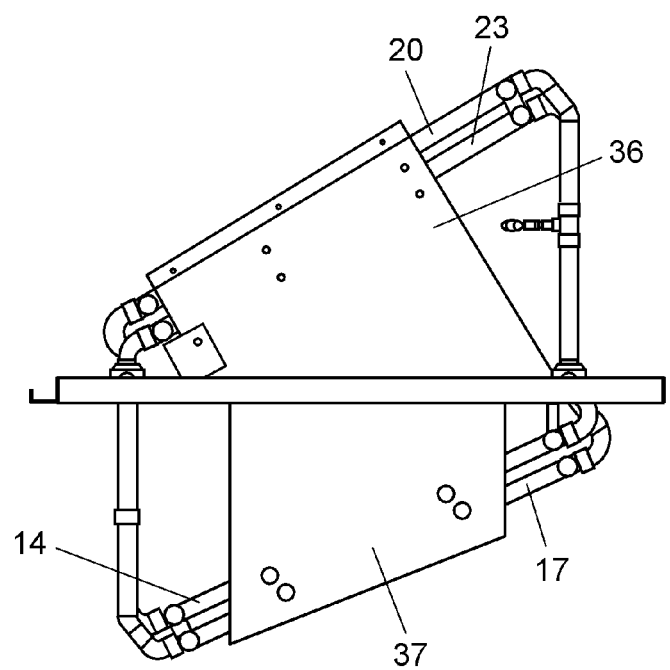
FIG. 10 is a sectional side view schematically illustrating a heat generating body box housing refrigeration device of a seventh exemplary embodiment of the present invention.

FIG. 10 is a sectional side view schematically illustrating the heat generating body box housing refrigeration device of the seventh exemplary embodiment of the present invention. As illustrated in FIG. 10, first condenser 20 and second condenser 23 are fixed to each other by heat exchanger plate 36, and first evaporator 14 and second evaporator 17 are fixed to each other by heat exchanger plate 37. Heat exchanger plate 36 and heat exchanger plate 37 are fixed to the condenser and the evaporator so as to support side surfaces of vent surfaces of the condenser and the evaporator, and heat exchanger plate 36 and heat exchanger plate 37 are fixed to partition plate 9 by screws such that fixing portions of partition plate 9 is bent into the L-shape.

As a result, the heat received from partition plate 9 is released in heat exchanger plate 36, and the heat received from high-temperature air 5 is transferred to partition plate 9 in heat exchanger plate 37. Therefore, in the heat generating body box housing refrigeration device of the seventh exemplary embodiment of the present invention, the heat exchange capability is enhanced and strength is further increased.

Eighth Exemplary Embodiment

In a heat generating body box housing refrigeration device according to an eighth exemplary embodiment of the present invention, the same structural element as the first exemplary embodiment is designated by the same reference mark, and its detailed description is omitted.

Figure 11:
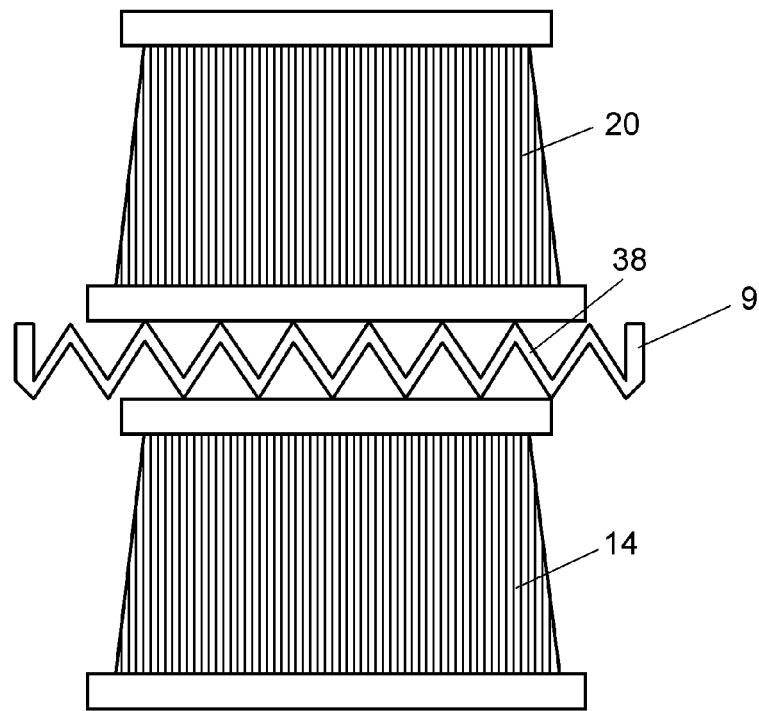
FIG. 11 is a front view illustrating a heat generating body box housing refrigeration device of an eighth exemplary embodiment of the present invention.

FIG. 11 is a front view illustrating the heat generating body box housing refrigeration device of the eighth exemplary embodiment of the present invention. As illustrated in FIG. 11, partition plate 9 has saw-tooth shape 38 when viewed from a direction of the air flow generated by outdoor blower 4 in FIG. 1. That is, partition plate 9 has a pleated shape in which a peak and a valley are made in the air-flow direction.

As a result, in the heat generating body box housing refrigeration device of the eighth exemplary embodiment of the present invention, because a surface area of partition plate 9 is enlarged to increase heat-releasing and heat-absorbing area, the heat exchange performance of partition plate 9 is improved.

Ninth Exemplary Embodiment

In a heat generating body box housing refrigeration device according to a ninth exemplary embodiment of the present invention, the same structural element as the first exemplary embodiment is designated by the same reference mark, and its detailed description is omitted.

Figure 12:
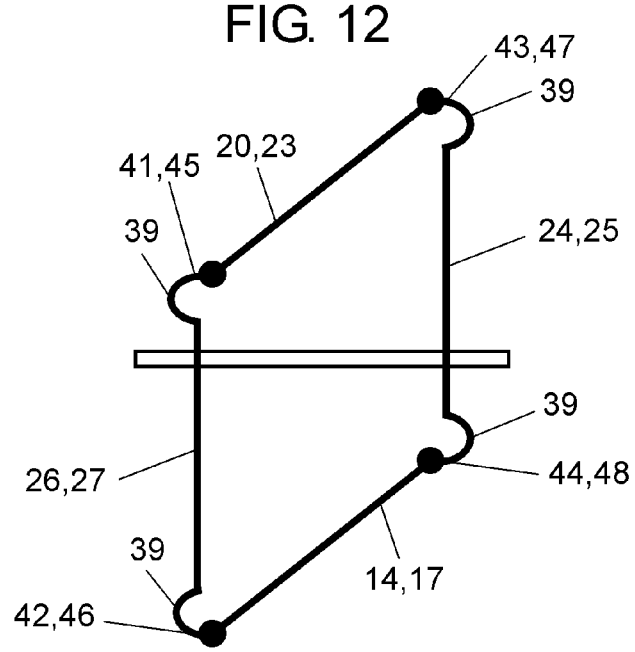
FIG. 12 is a sectional side view schematically illustrating a heat generating body box housing refrigeration device of a ninth exemplary embodiment of the present invention.

FIG. 12 is a sectional side view schematically illustrating the heat generating body box housing refrigeration device of the ninth exemplary embodiment of the present invention. As illustrated in FIG. 12, shapes of first refrigerant liquid pipe 26 and second refrigerant liquid pipe 27 and shapes of first refrigerant steam pipe 24 and second refrigerant steam pipe 25 have curved portions 39 at joints of first condenser 20, second condenser 23, first evaporator 14, and second evaporator 17. That is, first joint 41, second joint 42, third joint 43, fourth joint 44, fifth joint 45, sixth joint 46, seventh joint 47, and eighth joint 48 have the curved shapes.

As a result, in the heat generating body box housing refrigeration device of the ninth exemplary embodiment of the present invention, an impact such as an earthquake is absorbed by curved portion 39 to disperse the impact on the piping joint, so that a breakage of the piping joint and a gas leak can be prevented.

Tenth Exemplary Embodiment

In the first to ninth exemplary embodiments, the rectangular surface of the condenser and the rectangular surface of the evaporator are disposed in the same direction. However, sometimes the condenser and the evaporator are disposed orthogonal to each other, namely, sometimes the condenser and the evaporator are disposed such that planes including the rectangular surfaces of the condenser and evaporator are orthogonal to each other. In this case, a difference in length is generated between the refrigerant liquid pipe and the refrigerant steam pipe of the two refrigerant cycles, and sometimes the performance of one of the refrigerant cycles is significantly degraded.

Figure 13A:
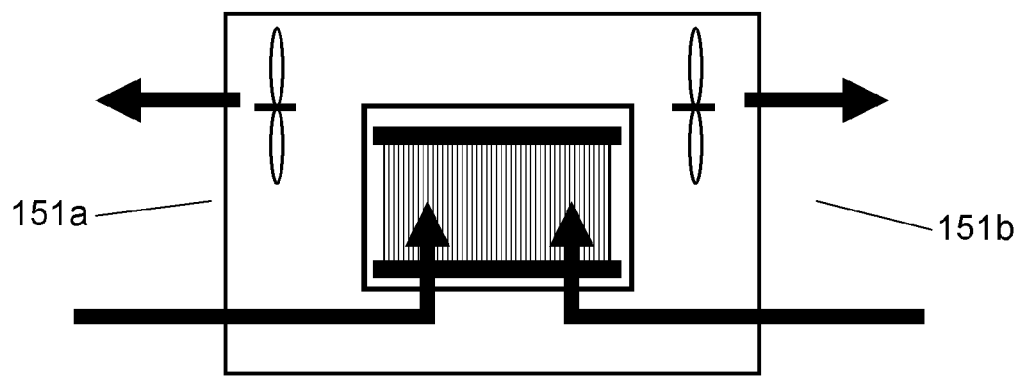
FIG. 13A is a horizontal sectional view schematically illustrating a condenser side of a heat generating body box housing refrigeration device of a tenth exemplary embodiment of the present invention.
Figure 13B:
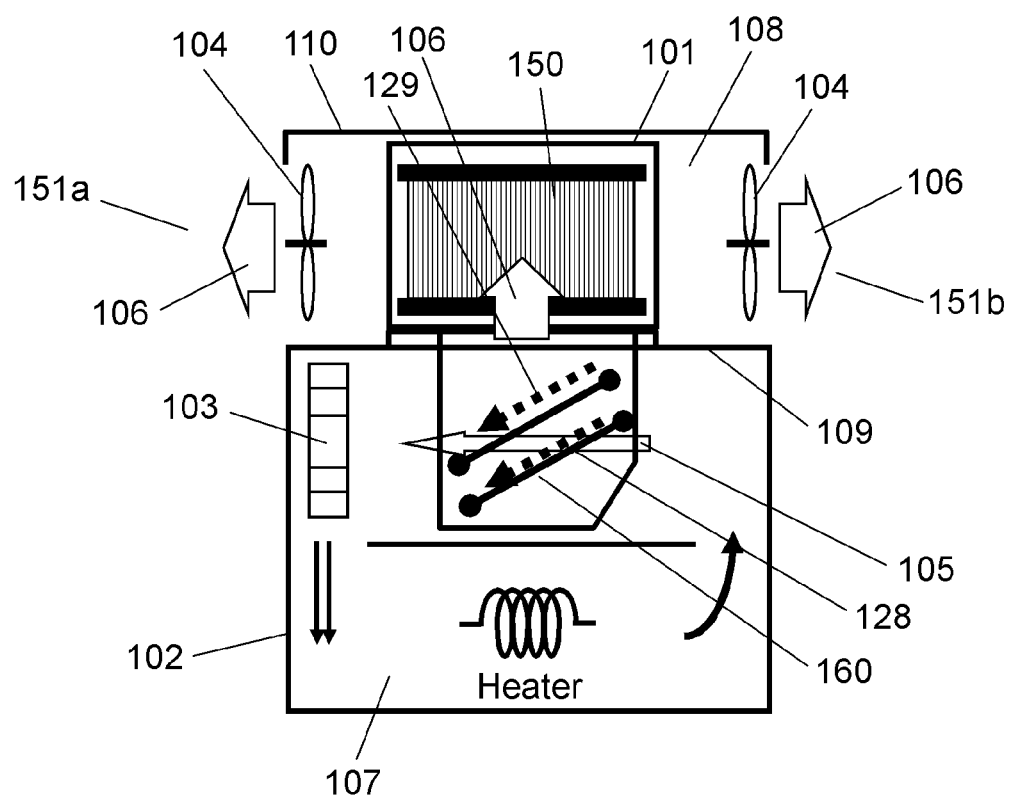
FIG. 13B is a sectional side view schematically illustrating the heat generating body box housing refrigeration device.

FIG. 13A is a horizontal sectional view schematically illustrating a condenser side of a heat generating body box housing refrigeration device according to a tenth exemplary embodiment of the present invention, and FIG. 13B is a sectional side view schematically illustrating the heat generating body box housing refrigeration device.

For example, heat generating body box housing refrigeration device 101 includes the electronic component generating the heat like the mobile-phone base station, and heat generating body box housing refrigeration device 101 is installed above and below a top side (partition plate 109) of closed heat generating body box housing 102. High-temperature air 105 passes through evaporator 160 by internal air blower 103. Low-temperature air 106 passes through condenser 150 by external air blower 104. Main body box 110 is partitioned by partition plate 109 such that high-temperature portion 107 to which high-temperature air 105 vents is located in a lower portion of partition plate 109 and such that low-temperature portion 108 to which low-temperature air 106 vents is located in an upper portion of partition plate 109.

Figure 14:
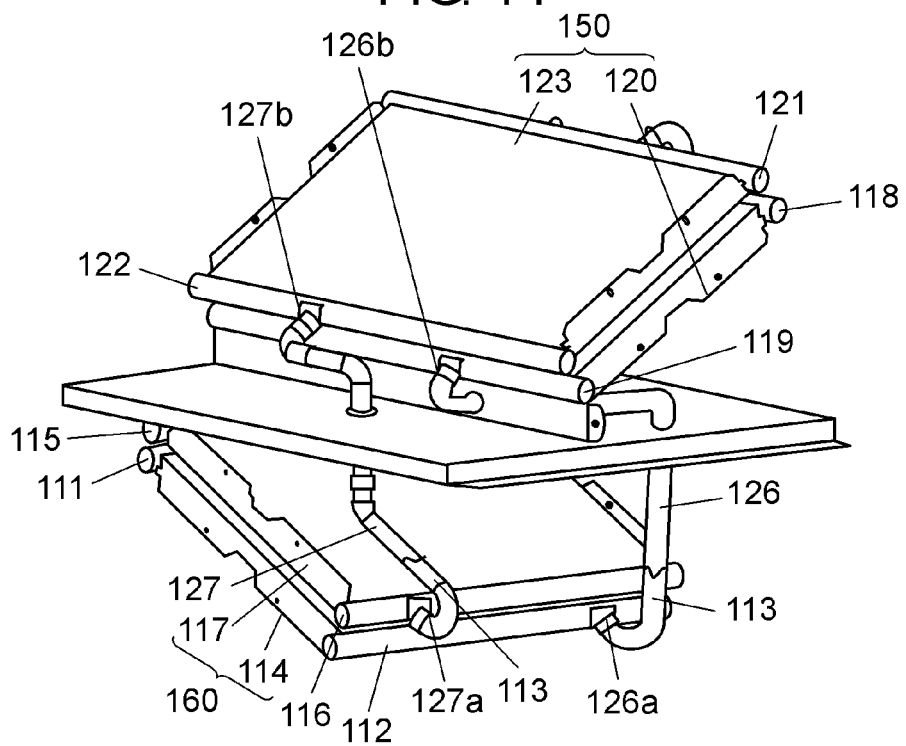
FIG. 14 is a perspective view illustrating a front surface of the heat generating body box housing refrigeration device.
Figure 15:
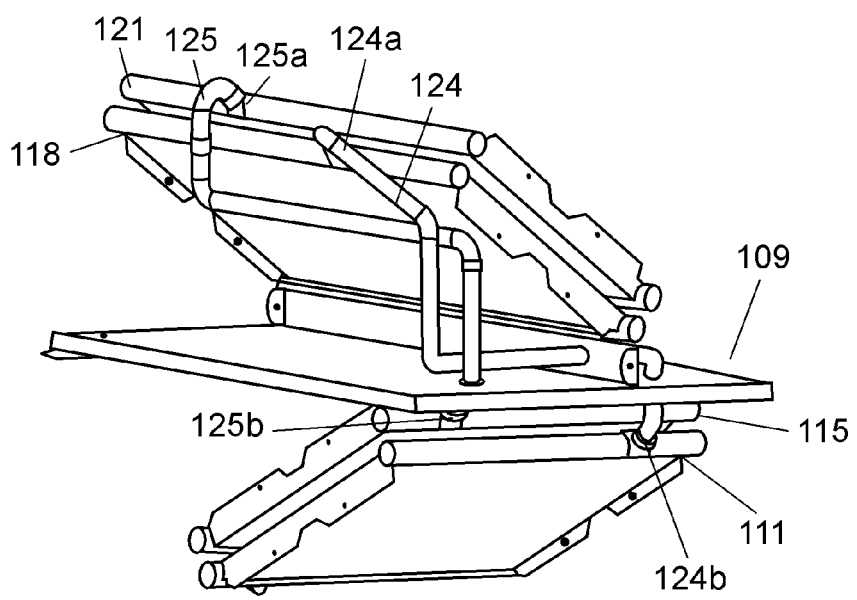
FIG. 15 is a perspective view illustrating a back surface of the heat generating body box housing refrigeration device.

FIG. 14 is a perspective view illustrating a front surface of the heat generating body box housing refrigeration device of the tenth exemplary embodiment of the present invention, and FIG. 15 is a perspective view illustrating a back surface of the heat generating body box housing refrigeration device. As illustrated in FIGS. 13A, 13B, 14 and 15, condenser 150 includes first condenser 120 and second condenser 123. Evaporator 160 includes first evaporator 114 and second evaporator 117.

Rectangular first evaporator 114 is disposed in high-temperature portion 107 in FIG. 13A, and includes first evaporator steam header 111 on the upper side and first evaporator liquid header 112 on the lower side. First evaporator 114 is disposed while inclined backward (or forward) with respect to a vent direction of high-temperature air 105, refrigerant 113 (for example, R134a) is enclosed in first evaporator 114, and refrigerant 113 receives the heat from high-temperature air 105 and is boiled and vaporized. Similarly, rectangular second evaporator 117 is disposed in high-temperature portion 107, and includes second evaporator steam header 115 on the upper side and second evaporator liquid header 116 on the lower side. Second evaporator 117 is disposed above first evaporator 114 while inclined in the same direction as first evaporator 114, refrigerant 113 (for example, R134a) is enclosed in second evaporator 117, and refrigerant 113 receives the heat from high-temperature air 105 and is boiled and vaporized.

Rectangular first condenser 120 is disposed in low-temperature portion 108 in FIG. 13A, and includes first condenser steam header 118 on the upper side and first condenser liquid header 119 on the lower side. First condenser 120 is communicated with first evaporator 114, and first condenser 120 is disposed while inclined orthogonal to the inclination direction of first evaporator 114. First condenser 120 condenses and devolatilizes the steam of boiled and vaporized refrigerant 113 by releasing the heat of the steam of refrigerant 113 to low-temperature air 106. Similarly, rectangular second condenser 123 is disposed in low-temperature portion 108, and includes second condenser steam header 121 on the upper side and second condenser liquid header 122 on the lower side. Second condenser 123 is communicated with second evaporator 117, and second condenser 123 is disposed above first condenser 120 while inclined orthogonal to the inclination direction of second evaporator 117. Second condenser 123 condenses and devolatilizes the steam of boiled and vaporized refrigerant 113 by releasing the heat of the steam of refrigerant 113 to low-temperature air 106.

First refrigerant steam pipe 124 communicates between first evaporator steam header 111 and first condenser steam header 118 while piercing partition plate 109. First steam connecting port A 124a and first steam connecting port B 124b are provided in one end portions of first condenser steam header 118 and first evaporator steam header 111, respectively.

Similarly, second refrigerant steam pipe 125 communicates between second evaporator steam header 115 and second condenser steam header 121 while piercing partition plate 109. In second evaporator steam header 115, second steam connecting port B 125b is provided in an end portion on the opposite side to first steam connecting port B 124b. In second condenser steam header 121, second steam connecting port A 125a is provided in an end portion on the opposite side to first steam connecting port A 124a. Second refrigerant steam pipe 125 connects second steam connecting port A 125a and second steam connecting port B 125b. Further, first refrigerant steam pipe 124 and second refrigerant steam pipe 125 are configured to have the substantially same length.

First refrigerant liquid pipe 126 communicates between first evaporator liquid header 112 and first condenser liquid header 119 while piercing partition plate 109. First liquid connecting port A 126a and first liquid connecting port B 126b are provided in end portions of first evaporator liquid header 112 and first condenser liquid header 119, respectively.

Similarly, second refrigerant liquid pipe 127 communicates between second evaporator liquid header 116 and second condenser liquid header 122 while piercing partition plate 109. In second evaporator liquid header 116, second liquid connecting port A 127a is provided in an end portion on the opposite side to first liquid connecting port A 126a. In second condenser liquid header 122, second liquid connecting port B 127b is provided in an end portion on the opposite side to first liquid connecting port B 126b. Second refrigerant liquid pipe 127 connects second liquid connecting port A 127a and second liquid connecting port B 127b. Further, first refrigerant liquid pipe 126 and second refrigerant liquid pipe 127 are configured to have the substantially same length.

As illustrated in FIG. 13B, heat generating body box housing refrigeration device 101 includes first refrigerant cycle 128 that is constructed by first evaporator 114 and first condenser 120 and second refrigerant cycle 129 that is constructed by second evaporator 117 and second condenser 123.

According to the configuration, the lengths of first refrigerant liquid pipe 126 and second refrigerant liquid pipe 127 are substantially equalized, and the lengths of first refrigerant steam pipe 124 and second refrigerant steam pipe 125 are substantially equalized. Therefore, the capability is not significantly degraded in one of the refrigerant cycles, but the capability of heat generating body box housing refrigeration device 101 is enhanced as a whole. Additionally, production efficiency is improved because first refrigerant cycle 128 and second refrigerant cycle 129 have the same refrigerant amount.

As illustrated in FIGS. 13A and 13B, in main body box 110, external air communication ports 151a and 151b are provided in two side surfaces that are disposed opposite each other in parallel to the vent direction of condenser 150. Remaining surfaces of main body box 110 are closed. External air blower 104 is provided so as to blow the air toward a vent surface of condenser 150. External air blower 104 is provided in front of or at the back of the vent surface of condenser 150, which enables external air blower 104 to blow the air to condenser 150. Internal air blower 103 is provided in heat generating body box housing 102.

A running operation of heat generating body box housing refrigeration device 101 will be described below.

The heat generated from a heat generating body in heat generating body box housing 102 heats up the air (hereinafter referred to as internal air) in heat generating body box housing 102. The high-temperature internal air circulates in heat generating body box housing 102 by running of internal air blower 103, and passes through evaporator 160. On the other hand, low-temperature external air passes through condenser 150 by the running of external air blower 104. As described above, the refrigerant in a gas state in condenser 150 is refrigerated by the external air ventilation, and condensed (devolatilized). The devolatilized refrigerant flows to the lower side of condenser 150, and flows into evaporator 160 through first refrigerant liquid pipe 126 and second refrigerant liquid pipe 127. The refrigerant in a liquid state in evaporator 160 is heated up by the internal air ventilation and vaporized. At this point, the refrigerant deprives the internal air of the heat to refrigerate the internal air. The vaporized refrigerant flows into condenser 150 through first refrigerant steam pipe 124 and second refrigerant steam pipe 125 again.

At this point, in main body box 110, external air communication ports 151a and 151b are provided in not the front surface of the vent surface of condenser 150, but the side surface parallel to the vent direction. That is, the air that passes in main body box 110 by the external air natural wind does not pass through a vent passage of condenser 150, but flows so as to come into contact with the surface of condenser 150. Accordingly, while external air blower 104 is stopped, the heat exchange is not performed too much in condenser 150, and the refrigeration is not excessively performed in heat generating body box housing refrigeration device 101. As described above, in the case of the relatively low temperature in heat generating body box housing 102, the refrigeration capability of heat generating body box housing refrigeration device 101 is controlled by stopping external air blower 104. Therefore, the excessive refrigeration of heat generating body box housing 102 can be prevented.

Figure 16:
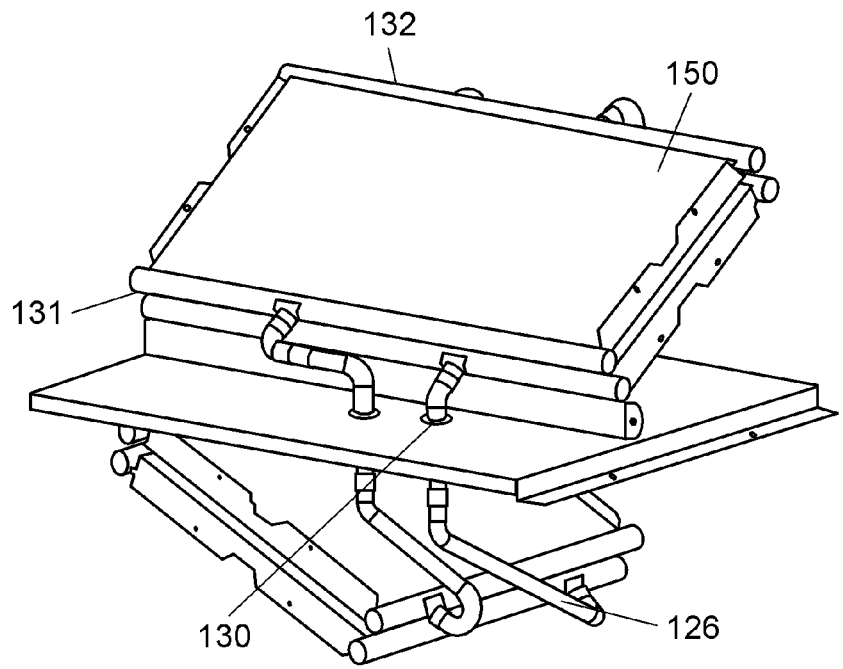
FIG. 16 is an explanatory view illustrating a liquid pipe partition hole piercing position portion of the heat generating body box housing refrigeration device.

FIG. 16 is an explanatory view illustrating a liquid pipe partition hole piercing position portion in the heat generating body box housing refrigeration device of the tenth exemplary embodiment of the present invention. As illustrated in FIG. 16, partition plate through-hole 130 for first refrigerant liquid pipe 126 may be made in a region on the opposite side to upper side portion 132 with respect to lower side portion 131.

Figure 17:
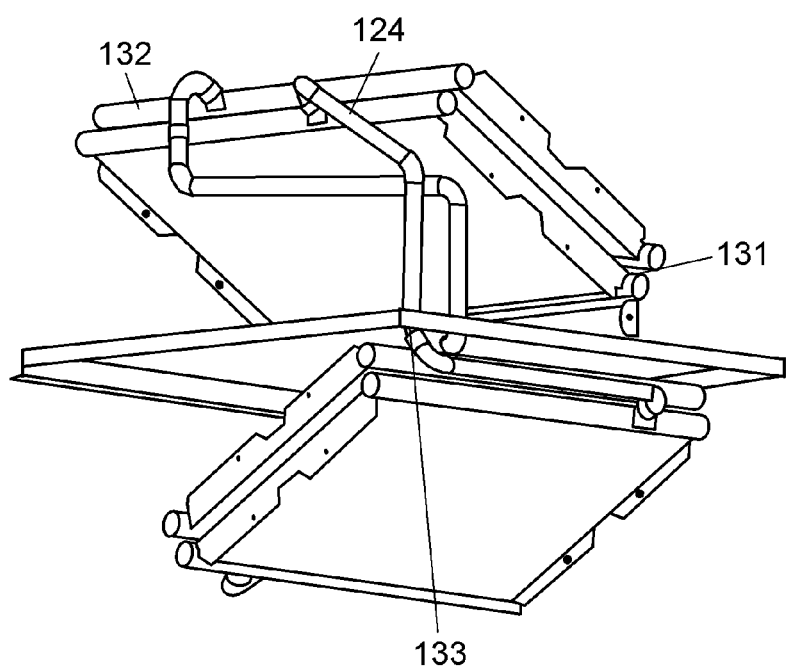
FIG. 17 is an explanatory view illustrating a position of a steam pipe partition hole piercing portion of the heat generating body box housing refrigeration device.

FIG. 17 is an explanatory view illustrating a position of a steam pipe partition hole piercing portion in the heat generating body box housing refrigeration device of the tenth exemplary embodiment of the present invention. As illustrated in FIG. 17, partition plate through-hole 133 for first refrigerant steam pipe 124 may be made in a region on the same side as upper side portion 132 with respect to lower side portion 131. According to the configuration, the number of bending times can decrease in first refrigerant liquid pipe 126 and first refrigerant steam pipe 124, and an upward gradient can easily be ensured because first refrigerant liquid pipe 126 and first refrigerant steam pipe 124 do not pass through a narrow space between partition plate 109 and condenser 150. As a result, because the refrigerant smoothly flows, the capability of heat generating body box housing refrigeration device 101 is enhanced as a whole.

Figure 18:
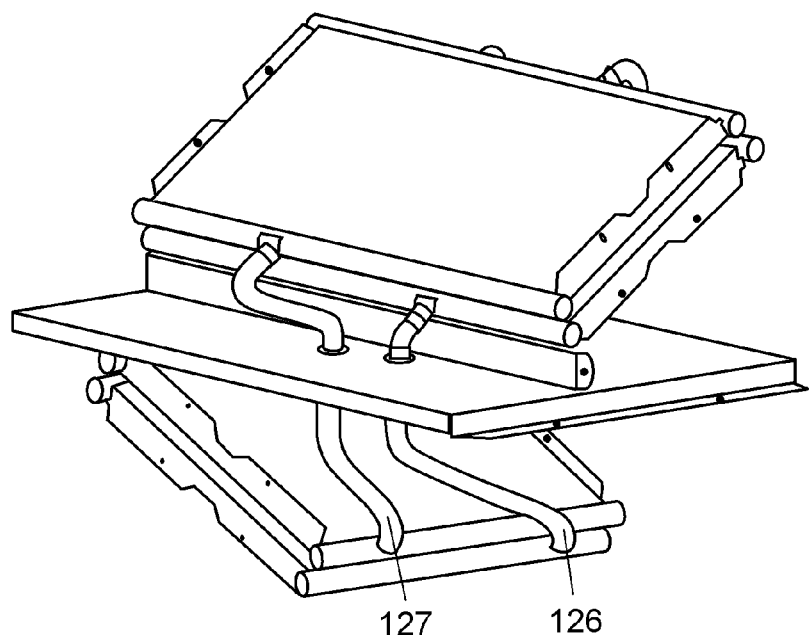
FIG. 18 is an explanatory view illustrating a gradient of a refrigerant liquid pipe of the heat generating body box housing refrigeration device.

FIG. 18 is an explanatory view illustrating a gradient of the refrigerant liquid pipe in the heat generating body box housing refrigeration device of the tenth exemplary embodiment of the present invention. As illustrated in FIG. 18, piping gradients of first refrigerant liquid pipe 126 and second refrigerant liquid pipe 127 may be set such that a downstream side of a refrigerant passage becomes a lower direction.

Figure 19:
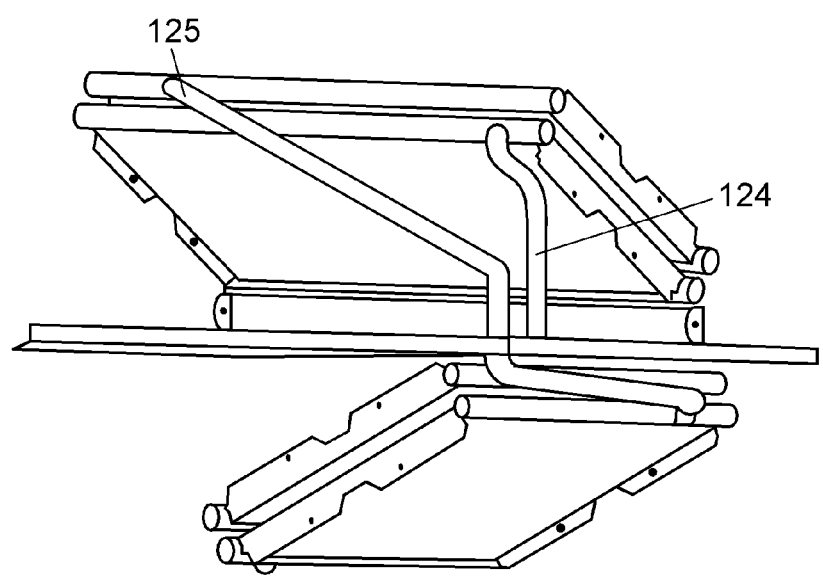
FIG. 19 is an explanatory view illustrating a gradient of a refrigerant steam pipe of the heat generating body box housing refrigeration device.
Figure 20A:
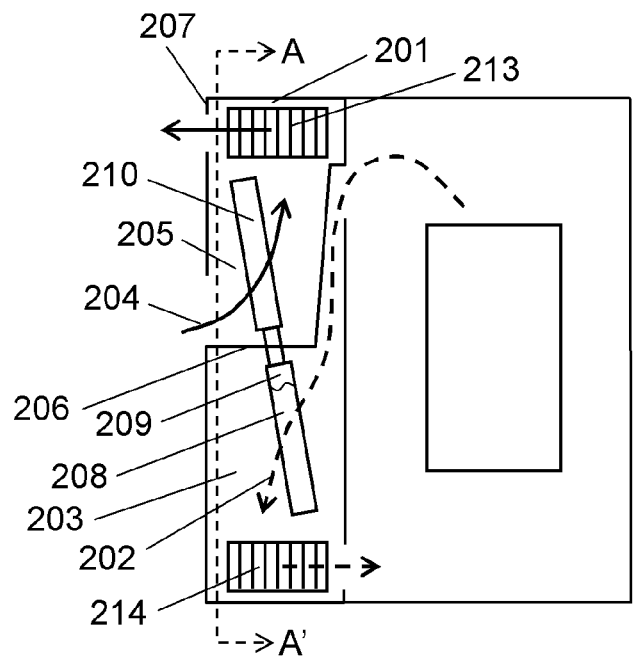
FIG. 20A is a front view illustrating a heat generating body box housing refrigeration device of the background art.
Figure 20B:
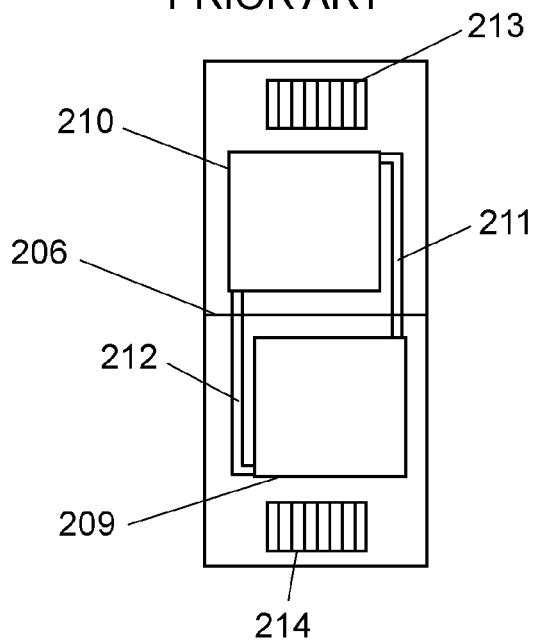
FIG. 20B is a side view illustrating the heat generating body box housing refrigeration device.

FIG. 19 is an explanatory view illustrating a gradient of the refrigerant steam pipe in the heat generating body box housing refrigeration device of the tenth exemplary embodiment of the present invention. As illustrated in FIG. 19, the piping gradients of first refrigerant steam pipe 124 and second refrigerant steam pipe 125 may be set such that the downstream side of the refrigerant passage becomes an upper direction.

INDUSTRIAL APPLICABILITY

The heat generating body box housing refrigeration device of the present invention can efficiently exert the heat exchange capability with a simple configuration and flexibly meet the demand for various heat exchange treatment capabilities, and the heat generating body box housing refrigeration device also has the strength against the impact such as the earthquake. Therefore, the heat generating body box housing refrigeration device is suitably used as the refrigeration device of the mobile-phone base station.

REFERENCE MARKS IN THE DRAWINGS

1,101 Heat generating body box housing refrigeration device
2,102 Heat generating body box housing
3 Indoor blower
4 Outdoor blower
5,105 High-temperature air
6,106 Low-temperature air
7,107 High-temperature portion
8,108 Low-temperature portion
9,109 Partition plate
10,110 Main body box
11,111 First evaporator steam header
12,112 First evaporator liquid header
13,113 Refrigerant
14,114 First evaporator
15,115 Second evaporator steam header
16,116 Second evaporator liquid header
17,117 Second evaporator
18,118 First condenser steam header
19,119 First condenser liquid header
20,120 First condenser
21,121 Second condenser steam header
22,122 Second condenser liquid header
23,123 Second condenser
24,124 First refrigerant steam pipe
25,125 Second refrigerant steam pipe
26,126 First refrigerant liquid pipe
27,127 Second refrigerant liquid pipe
28,128 First refrigerant cycle
29,129 Second refrigerant cycle
30 Third refrigerant cycle
31,32 Guide plate
33 Sealing component
34,35,36,37 Heat exchanger plate
38 Saw-tooth shape
39 Curved portion
41 First joint
42 Second joint
43 Third joint
44 Fourth joint
45 Fifth joint
46 Sixth joint
47 Seventh joint
Eighth joint
103 Internal air blower
104 External air blower
124*a* First steam connecting port A
124*b* First steam connecting port B
125*a* Second steam connecting port A
125*b* Second steam connecting port B
126*a* First liquid connecting port A
126*b* First liquid connecting port B
127*a* Second liquid connecting port A
127*b* Second liquid connecting port B
130,133 Partition plate through-hole
131 Lower side portion
132 Upper side portion
150 Condenser
160 Evaporator

The invention claimed is:

1. A heat generating body box housing refrigeration device comprising:
a first condenser and a second condenser that condense a refrigerant;
a first evaporator and a second evaporator that vaporize the refrigerant;
an outdoor blower that sucks air outside of the heat generating body box housing and blows the air to promote heat transfers of the first condenser and the second condenser;
a partition plate having a first side and a second side; and
a sealing component,
wherein the first condenser and the first evaporator are connected with a first refrigerant liquid pipe and a first vapor phase refrigerant pipe to constitute a first refrigerant cycle, the second condenser and the second evaporator are connected with a second refrigerant liquid pipe and a second vapor phase refrigerant pipe to constitute a second refrigerant cycle, the first condenser of a rectangular shape includes a first condenser steam header on an upper side and a first condenser liquid header on a lower side, the first evaporator of a rectangular shape includes a first evaporator steam header on an upper side and a first evaporator liquid header on a lower side, the second condenser of a rectangular shape includes a second condenser steam header on an upper side and a second condenser liquid header on a lower side, the second evaporator of a rectangular shape includes a second evaporator steam header on an upper side and a second evaporator liquid header on a lower side, the first condenser, the second condenser, the first evaporator, and the second evaporator are vertically disposed with respect to each other, the first refrigerant liquid pipe is connected between a first joint in one end portion of the first condenser liquid header and a second joint in one end portion of the first evaporator liquid header, the first vapor phase refrigerant pipe is connected between a third joint of the first condenser steam header and a fourth joint of the first evaporator steam header, the third joint located diagonally with respect to the first joint in the first condenser, and the fourth joint located diagonally with respect to the second joint in the first evaporator, the second refrigerant liquid pipe is connected between a fifth joint of the second condenser liquid header and a sixth joint of the second evaporator liquid header, the fifth joint located in a position facing another end portion different from that of the first joint, and the sixth joint located in a position facing another end portion different from that of the second joint, the second vapor phase refrigerant pipe is connected between a seventh joint of the second condenser steam header and an eighth joint of the second evaporator steam header, the seventh joint located in a position facing another end portion different from that of the third joint, and the eighth joint located in a position facing another end portion different from that of the fourth joint, the first condenser and the second condenser being located in a direction of the first side of the partition plate and being inclined relative to the partition plate, the first evaporator and the second evaporator being located in a direction of the second side of the partition plate and being inclined relative to the partition plate, and the sealing component being attached to the second condenser liquid header or the first condenser liquid header, the sealing component being flat and titled to the same angle as the second condenser relative to the partition plate.

2. The heat generating body box housing refrigeration device according to claim 1, further comprising a guide plate provided in parallel to a direction of the air sucked or blown by the outdoor blower in a manner to extend to the windward side from any of the first condenser liquid header and the second condenser liquid header for guiding flow of the air.

3. The heat generating body box housing refrigeration device according to claim 1, wherein
the partition plate is formed into a saw-tooth shape when viewed from a direction of an air flow generated by the outdoor blower.

4. The heat generating body box housing refrigeration device according to claim 1, wherein
the first joint, the second joint, the third joint, the fourth joint, the fifth joint, the sixth joint, the seventh joint and the eighth joint have a curved outer shape.

5. The heat generating body box housing refrigeration device according to claim 1, further comprising a third refrigerant cycle.

6. The heat generating body box housing refrigeration device according to claim 1, wherein
the first condenser and the second condenser are inclined such that the first condenser and the second condenser are parallel to each other, and the first evaporator and the second evaporator are inclined such that the first evaporator and the second evaporator are parallel to each other.

7. The heat generating body box housing refrigeration device according to claim 6, wherein
in the first condenser and the second condenser, a distance between the first condenser liquid header and the second condenser liquid header is greater than a distance between the first condenser steam header and the second condenser steam header.

8. The heat generating body box housing refrigeration device according to claim 1, further comprising a heat exchanger plate provided on each of upper and lower surfaces of the partition plate in an orientation parallel to an air flow produced by the outdoor blower.

9. The heat generating body box housing refrigeration device according to claim 8, wherein
the first condenser, the second condenser, the first evaporator and the second evaporator are fixed to the heat exchanger plate.

10. A heat generating body box housing refrigeration device comprising:
a first condenser and a second condenser that condense a refrigerant;
a first evaporator and a second evaporator that vaporize the refrigerant;
an indoor blower that blows air in a heat generating body box housing to promote heat transfer of the first evaporator and the second evaporator;
an outdoor blower that sucks air outside of the heat generating body box housing and blows the air to promote heat transfer of the first condenser and the second condenser;
a partition plate having a first side and a second side; and
a sealing component, wherein
the first condenser and the first evaporator are connected with a first refrigerant liquid pipe and a first vapor phase refrigerant pipe to constitute a first refrigerant cycle,
the second condenser and the second evaporator are connected with a second refrigerant liquid pipe and a second vapor phase refrigerant pipe to constitute a second refrigerant cycle,
the first condenser of a rectangular shape includes a first condenser steam header on an upper side and a first condenser liquid header on a lower side,
the first evaporator of a rectangular shape includes a first evaporator steam header on an upper side and a first evaporator liquid header on a lower side,
the second condenser of a rectangular shape includes a second condenser steam header on an upper side and a second condenser liquid header on a lower side,
the second evaporator of a rectangular shape includes a second evaporator steam header on an upper side and a second evaporator liquid header on a lower side the first condenser, the first condenser liquid header and the second condenser liquid header and the first evaporator liquid header and the second evaporator liquid header are vertically disposed with distances provided from one another, a vertical plane including the first condenser liquid header is orthogonal to a vertical plane including the first evaporator liquid header, the first refrigerant liquid pipe is connected to one end portion of the first condenser liquid header and one end portion of the first evaporator liquid header, the second refrigerant liquid pipe is connected to an end portion of the second condenser liquid header opposite to another end portion facing the one end portion of the first condenser liquid header and an end portion of the second evaporator liquid header opposite to another end portion facing the one end portion of the first evaporator liquid header, the first vapor phase refrigerant pipe is connected to one end portion of the first condenser steam header and one end portion of the first evaporator liquid header, the second vapor phase refrigerant pipe is connected to an end portion of the second condenser steam header opposite to another end portion facing the one end portion of the first condenser liquid header and an end portion of the second evaporator steam header opposite to another end portion facing the one end portion of the first evaporator steam header, the first condenser and the second condenser being located in a direction of the first side of the partition plate and being inclined relative to the partition plate, the first evaporator and the second evaporator being located in a direction of the second side of the partition plate and being inclined relative to the partition plate and the sealing component being attached to the second condenser liquid header or the first condenser liquid header, the sealing component being flat and titled to the same angle as the second condenser relative to the partition plate.

* * * * *